(12) United States Patent
Song et al.

(10) Patent No.: US 12,075,638 B2
(45) Date of Patent: Aug. 27, 2024

(54) ARRAY SUBSTRATE, DISPLAY PANEL, AND DISPLAY DEVICE

(71) Applicant: Wuhan China Star Optoelectronics Technology Co., Ltd., Wuhan (CN)

(72) Inventors: Jiyue Song, Wuhan (CN); Fei Ai, Wuhan (CN); Dewei Song, Wuhan (CN); Fan Gong, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/278,694

(22) PCT Filed: Feb. 26, 2021

(86) PCT No.: PCT/CN2021/078204
§ 371 (c)(1),
(2) Date: Mar. 23, 2021

(87) PCT Pub. No.: WO2022/147895
PCT Pub. Date: Jul. 14, 2022

(65) Prior Publication Data
US 2023/0354624 A1    Nov. 2, 2023

(30) Foreign Application Priority Data
Jan. 8, 2021 (CN) .......................... 202110022634.7

(51) Int. Cl.
*H10K 30/80* (2023.01)
*H10K 39/32* (2023.01)
*G06V 40/13* (2022.01)

(52) U.S. Cl.
CPC ............. *H10K 30/80* (2023.02); *H10K 39/32* (2023.02); *G06V 40/1318* (2022.01)

(58) Field of Classification Search
CPC ..... H10K 30/80; H10K 39/32; G06V 40/1318
See application file for complete search history.

(56) References Cited

U.S. PATENT DOCUMENTS 10,962,850 B1 *   3/2021   Yang ................. G02F 1/136209
11,754,868 B2 *   9/2023   Yang ................... G02F 1/13338
                                                                    349/12
(Continued)

FOREIGN PATENT DOCUMENTS

CN          105723381 A        6/2016
CN          106022324 A       10/2016
(Continued)

*Primary Examiner* — Shaun M Campbell
(74) *Attorney, Agent, or Firm* — Nathan & Associates; Menachem Nathan

(57) ABSTRACT

An array substrate, a display panel, and a display device are provided by the present application. The array substrate includes a base substrate; a light-sensitive component layer disposed on the base substrate, wherein a plurality of light-sensitive components are disposed at intervals in the light-sensitive component layer; and a first light-shielding layer disposed on the light-sensitive component layer. An orthographic projection of the first light-shielding layer on the base substrate partially overlaps with an orthographic projection of each of the light-sensitive components on the array substrate.

19 Claims, 3 Drawing Sheets

(56) References Cited

U.S. PATENT DOCUMENTS

| | | | | |
|---|---|---|---|---|
| 2004/0252867 A1* | 12/2004 | Lan | ............... | G06V 40/1318 |
| | | | | 382/124 |
| 2018/0299725 A1* | 10/2018 | Huang | ............... | G06V 40/1306 |
| 2020/0034600 A1* | 1/2020 | Chan | ............... | G06F 3/0412 |
| 2020/0134284 A1* | 4/2020 | Ling | ............... | H10K 59/126 |
| 2020/0184178 A1* | 6/2020 | Zhou | ............... | H10K 59/65 |
| 2020/0403168 A1* | 12/2020 | Li | ............... | H10K 77/10 |
| 2020/0411608 A1* | 12/2020 | Tang | ............... | H10K 59/353 |
| 2023/0095257 A1* | 3/2023 | Chen | ............... | H10K 59/122 |
| | | | | 257/40 |

FOREIGN PATENT DOCUMENTS

| | | | | |
|---|---|---|---|---|
| CN | 106684202 A | 5/2017 | | |
| CN | 107423723 A | 12/2017 | | |
| CN | 107845666 A | 3/2018 | | |
| CN | 108140125 A | 6/2018 | | |
| CN | 108596096 A | 9/2018 | | |
| CN | 108735786 A | 11/2018 | | |
| CN | 109686808 A | 4/2019 | | |
| CN | 109709696 A | 5/2019 | | |
| CN | 110286796 A | 9/2019 | | |
| CN | 110427931 A | 11/2019 | | |
| CN | 110596979 A | 12/2019 | | |
| CN | 110729309 A | 1/2020 | | |
| CN | 110750021 A | 2/2020 | | |
| CN | 111160323 A | 5/2020 | | |
| CN | 111752028 A * | 10/2020 | ........... | G02F 1/1333 |
| CN | 112071861 A | 12/2020 | | |

\* cited by examiner

ARRAY SUBSTRATE, DISPLAY PANEL, AND DISPLAY DEVICE

FIELD OF INVENTION

The present application relates to display device technology field, and particularly relates to an array substrate, a display panel, and a display device.

With continuous development of full screen technology, proportion of display region in display panels is continuously expanding. An integration of fingerprint identification regions into the display panels has become a trend to improve screen-to-body ratio and achieve full screen.

Fingerprint identification technology has been widely used in small and medium-sized panels, and mainly includes several forms such as capacitive fingerprint identification, ultrasonic fingerprint identification, and optical fingerprint identification, etc. Currently, a relatively mature scheme is capacitive fingerprint identification. Working principle of capacitive fingerprint identification is as below: silicon wafer is used to form an electric field with conductive subcutaneous electrolyte, and accurate fingerprint detection can be realized according to various voltage differences between the silicon wafer and the conductive subcutaneous electrolyte caused by uneven valleys and ridges of fingerprints. However, for capacitive fingerprint identification, when fingers get wet, detection effect of fingerprint will significantly worsen. Compared with capacitive fingerprint identification, ultrasonic fingerprint identification technology has advantages of high penetration, greater stability, and greater accuracy. However, it has a higher cost.

Optical fingerprint identification technology utilizes a principle of refraction and reflection of light. When light irradiates fingers and is reflected by the fingers to a light-sensitive fingerprint sensor, as light reflection of the valleys and ridges of fingerprints differ from each other, an intensity of reflected light by the valleys and ridges which is received by the fingerprint sensor differ from each other, and then optical signals are converted into electrical signals for fingerprint identification. Optical fingerprint identification technology has great stability, strong penetration ability, and relatively low cost.

However, at present, mobile phones or tablets equipped with optical fingerprint identification function are self-luminous organic light-emitting diode (OLED) screens. For mobile phones with liquid crystal display (LCD) screens, difficulty in integrating optical fingerprint identification function into the LCD screens is increased due to restrictions of backlight, aperture ratio, and other factors, which reduces accuracy of fingerprint identification.

SUMMARY OF INVENTION

An array substrate, a display panel, and a display device are provided by the present application to solve the problem of increased difficulty in integrating optical fingerprint identification function into the LCD screens.

In a first aspect, an array substrate comprises:
a base substrate;
a light-sensitive component layer disposed on the base substrate, wherein a plurality of light-sensitive components are disposed at intervals in the light-sensitive component layer; and
a first light-shielding layer disposed on the light-sensitive component layer, wherein an orthographic projection of the first light-shielding layer on the base substrate partially overlaps with an orthographic projection of each of the light-sensitive components on the base substrate.

In the array substrate of the present application, the first light-shielding layer is a black matrix layer, the black matrix layer comprises a plurality of black matrices disposed at intervals, and an orthographic projection of each of the black matrices on the base substrate partially overlaps with an orthographic projection of each of the light-sensitive components on the base substrate.

In the array substrate of the present application, thickness of the black matrix layer ranges from 0.3 microns to 1 micron.

The array substrate of the present application further comprises:
a first metal layer disposed on the base substrate, wherein the light-sensitive component comprises a cathode, the first metal layer comprises a touch wire, and the touch wire and the cathode are disposed at intervals in the first metal layer.

The array substrate of the present application further comprises:
a first electrode layer disposed on the light-sensitive components, wherein the first electrode layer comprises a touch electrode, and the touch wire is connected to the touch electrode; and
a second electrode layer disposed on the black matrices, wherein the light-sensitive component comprises an anode, the second electrode layer comprises a pixel electrode, and the pixel electrode and the anode are disposed at intervals in the second electrode layer.

In the array substrate of the present application, the light-sensitive component layer comprises:
a first insulating layer disposed on the first metal layer, wherein a via is located in the first insulating layer;
a first semiconductor layer disposed in the via; and
an intrinsic semiconductor layer disposed on the first semiconductor layer.

In the array substrate of the present application, the light-sensitive component layer further comprises:
a second semiconductor layer disposed on the intrinsic semiconductor layer.

In the array substrate of the present application, a material of the first semiconductor layer comprises N-type amorphous silicon, a material of the intrinsic semiconductor layer comprises amorphous silicon, and a material of the second semiconductor layer comprises P-type amorphous silicon.

In the array substrate of the present application, a collimating hole is located in the first light-shielding layer and the orthographic projection of the light-sensitive component on the base substrate is partially located in the collimating hole.

In the array substrate of the present application, a diameter of the collimating hole ranges from 5 microns to 10 microns.

In the array substrate of the present application, an orthographic projection of a middle part of the light-sensitive component on the base substrate is located in the collimating hole, and orthographic projections of two ends of the light-sensitive component on the base substrate overlap with the first light-shielding layer respectively.

In a second aspect, a display panel is also provided by the present application, comprising an array substrate, wherein the array substrate comprises:

a base substrate;

a light-sensitive component layer disposed on the base substrate, wherein a plurality of light-sensitive components are disposed at intervals in the light-sensitive component layer; and a first light-shielding layer disposed on the light-sensitive component layer, wherein an orthographic projection of the first light-shielding layer on the base substrate partially overlaps with an orthographic projection of each of the light-sensitive components on the base substrate.

In the display panel of the present application, the first light-shielding layer is a black matrix layer, the black matrix layer comprises a plurality of black matrices disposed at intervals, and an orthographic projection of each of the black matrices on the base substrate partially overlaps with an orthographic projection of each of the light-sensitive components on the base substrate.

In the display panel of the present application, a thickness of the black matrix layer ranges from 0.3 microns to 1 micron.

The display panel of the present application further comprises:

a first metal layer disposed on the base substrate, wherein the light-sensitive component comprises a cathode, the first metal layer comprises a touch wire, and the touch wire and the cathode are disposed at intervals in the first metal layer.

The display panel of the present application further comprises:

a first electrode layer disposed on the light-sensitive components, wherein the first electrode layer comprises a touch electrode, and the touch wire is connected to the touch electrode; and a second electrode layer disposed on the black matrices, wherein the light-sensitive component comprises an anode, the second electrode layer comprises a pixel electrode, and the pixel electrode and the anode are disposed at intervals in the second electrode layer.

In the display panel of the present application, the light-sensitive component layer further comprises:

a first insulating layer disposed on the first metal layer, wherein a via is located in the first insulating layer;

a first semiconductor layer disposed in the via; and an intrinsic semiconductor layer disposed on the first semiconductor layer.

In the display panel of the present application, a collimating hole is located in the first light-shielding layer and the orthographic projection of the light-sensitive component on the base substrate is partially located in the collimating hole.

In the display panel of the present application, a diameter of the collimating hole ranges from 5 microns to 10 microns.

In a third aspect, a display device comprising the display panel is provided.

The advantageous effects of the present application are as below: the base substrate, the light-sensitive component layer, and the first light-shielding layer are stacked to improve the integration of fingerprint identification region of the array substrate, and reduce the interference of optical noise to improve the sensitivity of fingerprint identification at the same time.

BRIEF DESCRIPTION OF DRAWINGS

The technical solutions and its advantage effects of the present application will be obvious through detailed description of specific embodiments of the present application in the following with reference to the accompanying drawings.

DETAILED DESCRIPTION OF EMBODIMENTS

Figure 1:
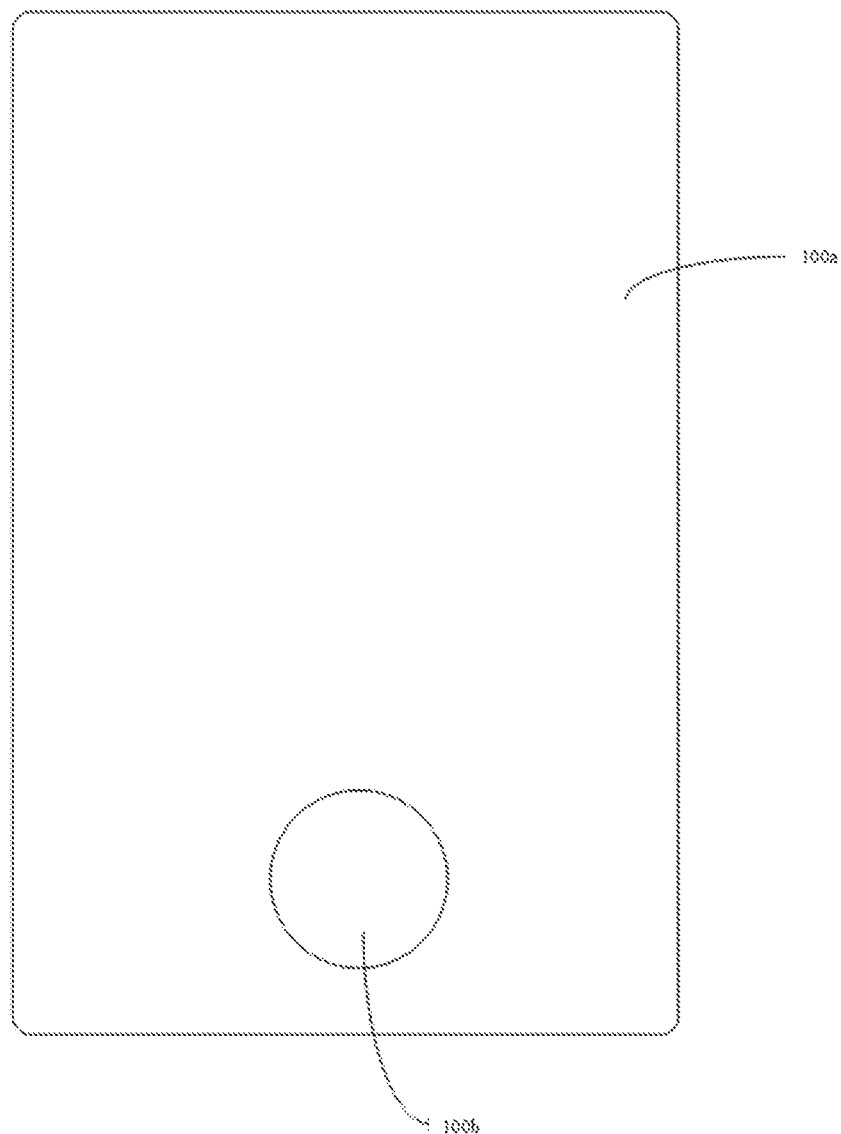
FIG. 1 is a structural schematic diagram of an array substrate provided by the present application.

The present application is further described in detail below with reference to the accompanying drawings and embodiments. Obviously, the following described embodiments are only part of the present application but not all. A person having ordinary skill in the art may obtain other embodiments based on the embodiments provided in the present application without making any creative effort, which all belong to the scope of the present application.

In the description of the present application, it is to be understood that, orientations or position relationships indicated by terms such as "center", "longitudinal", "transverse", "length", "width", "thickness", "upper", "lower", "front", "rear", "left", "right", "vertical", "horizontal", "top", "bottom", "inner", "outer", "clockwise", and "counterclockwise" are orientations or position relationships shown based on the accompanying drawings, and are merely used for describing the present application and simplifying the description, rather than indicating or implying that the apparatus or element should have a particular orientation or be constructed and operated in a particular orientation, and therefore, should not be construed as a limitation to the present application. In addition, terms "first" and "second" are used only for description purposes, and shall not be understood as indicating or suggesting relative importance or implicitly indicating a quantity of indicated technical features. Therefore, features defined by "first" and "second" may explicitly or implicitly include one or more of the above-mentioned features. In the description of the present application, unless otherwise specifically limited, "a plurality of" means there are at least two elements.

In the embodiments of the present application, it is appreciated that terms "dispose", "interconnect", and "connect" should be understood in a broad sense unless otherwise specified and limited. For example, terms "interconnect" and "connect" may refer to fixedly connect, detachably connect, or integrally connect. The terms "interconnect" and "connect" may also refer to mechanically connect, electrically connect, or communicate with each other. The terms "interconnect" and "connect" may also refer to directly connect, indirectly connect through an intermediate medium, intercommunicate interiors of two elements, or interact between two elements. For those of ordinary skill in the art, the specific meanings of the above terms in the embodiments of the present application can be understood according to specific situations.

In the embodiments of the present application, unless otherwise specified and limited, a first feature being disposed "above" or "below" a second feature may indicate that the first feature and the second feature are directly contacted with each other, or the first feature and the second feature are indirectly contacted via an intermediate medium. Moreover, the first feature being disposed "above" the second feature may indicate that the first feature is directly above or obliquely above the second feature, or merely indicate that the first feature is higher in horizontal height than the second feature. The first feature being disposed "below" the second feature may indicate that the first feature is directly below or obliquely below the second feature, or merely indicate that the first feature is lower in the horizontal height than the second feature.

Various embodiments or examples are provided herein for realizing various structures. To simplify the disclosure of the present application, components and arrangements of specific examples are described below, and of course, are only exemplary and are not intended to limit the present application. In addition, same reference numerals and/or reference letters can be repeated in different embodiments according to the present application, and such repetition is for the purpose of simplification and clarity, without indicating the relationships between various embodiments and/or arrangements in discuss. Moreover, the present application provides examples of various specific processes and materials, but the applicability of other processes and/or disclosure of other materials may be appreciated by those having ordinary skill in the art.

Figure 2:
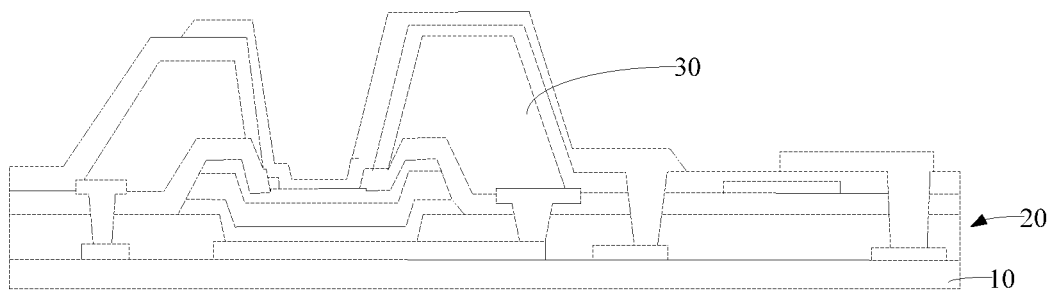
FIG. 2 is a cross-sectional schematic diagram of the array substrate provided by embodiments of the present application.
Figure 3:
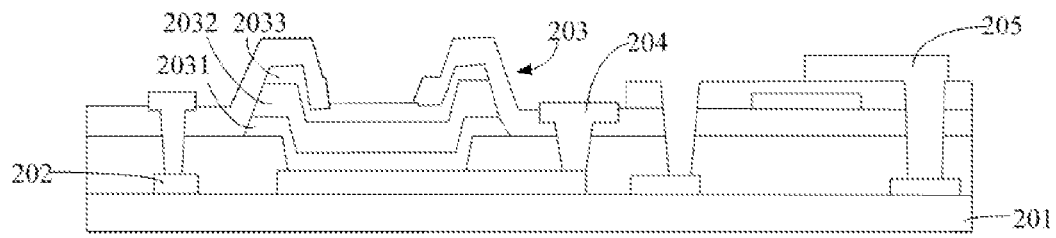
FIG. 3 is a cross-sectional schematic diagram of a light-sensitive component layer provided by embodiments of the present application.

Please refer to FIG. 1 to FIG. 3, an array substrate is provided by the present application, including: a base substrate 10, a light-sensitive component layer 20, and a first light-shielding layer 30.

A display region 100a and a fingerprint identification region 100b are configured in the base substrate 10. A plurality of thin film transistors (TFTs) are arranged in an array on the base substrate 10.

The light-sensitive component layer 20 is disposed on the base substrate 10. A plurality of light-sensitive components 203 are disposed in the light-sensitive component layer 20. In the embodiments of the present application, the fingerprint identification region 100b is located in the display region 100a. The plurality of light-sensitive components 203 are disposed at intervals from each other, and each of the light-sensitive components 203 can be disposed in a sub-pixel gap in the fingerprint identification region 100b to allow the fingerprint identification region 100b to perform fingerprint identification while displaying pictures; or each of the light-sensitive components 203 can be disposed in any of the sub-pixel gaps in the display region 100a of the array substrate to realize full screen fingerprint identification, which is not specifically restricted by the embodiments of the present application.

The first light-shielding layer 30 is disposed on the light-sensitive component layer 20, and an orthographic projection of the first light-shielding layer 30 on the base substrate partially overlaps with an orthographic projection of each of the light-sensitive components 203 on the base substrate. Wherein, the first light-shielding layer 30 partially overlaps with the light-sensitive component 203 can be for example, through a via defined in the first light-shielding layer to expose the light-sensitive component 203 in the via to realize partial overlapping.

The base substrate 10, the light-sensitive component layer 20, and the first light-shielding layer 30 of the array substrate provided by the present application are stacked to improve the integration of fingerprint identification region of the array substrate, and reduce the interference of optical noise to improve the sensitivity of fingerprint identification at the same time.

In some embodiments, the first light-shielding layer 30 is a black matrix layer, the black matrix layer 30 includes a plurality of black matrices disposed at intervals, and an orthographic projection of each of the black matrices on the base substrate partially overlaps with an orthographic projection of each of the light-sensitive components 203 on the base substrate 10. It can be understood that black material with light-shielding function, i.e., ink, can be used as the material of the first light-shielding layer besides the black matrix material.

In some embodiments, a thickness of the black matrix layer 30 can be in a range of 0.3 microns to 1 micron, for example, the thickness of the black matrix layer 30 can be 0.3 microns. A relatively small thickness of the black matrix layer is conducive to the reduction of a thickness of the array substrate so as to realize the light weight of the array substrate. The thickness of the black matrix layer 30 can also be 1 micron, so that manufacturing difficulty can be reduced during manufacturing processes such as forming holes in the black matrix layer, etc. In addition, greater climbing difficulty of other film layers due to the excessive thickness of the black matrix layer can be prevented, reducing problem of broken lines, which is conducive to the reduction of scrap rate of subsequent film layer manufacturing.

Figure 4:
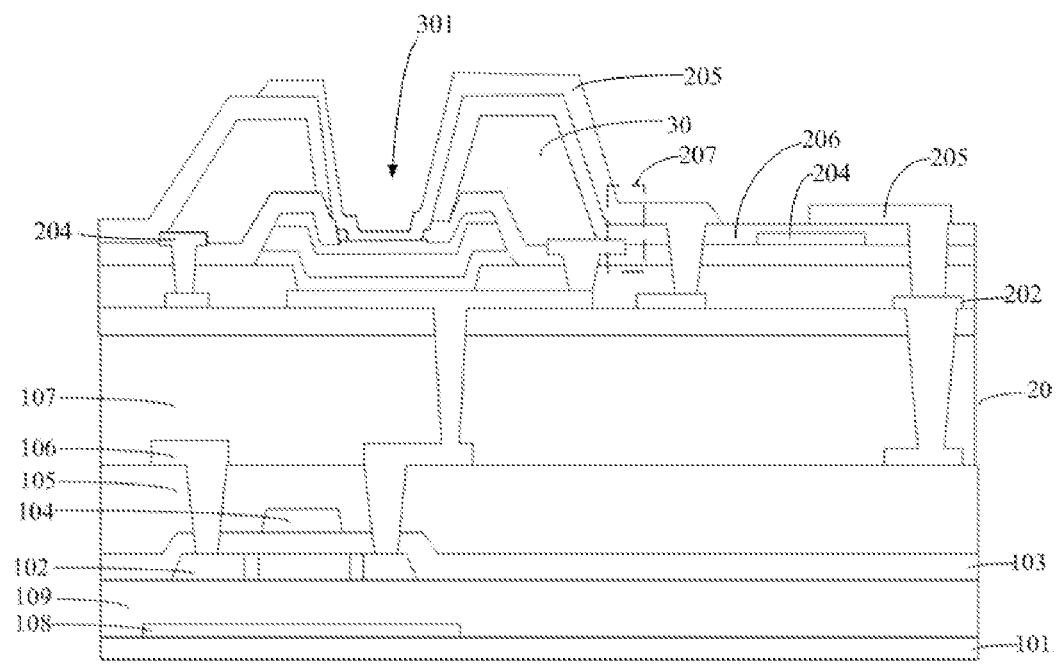
FIG. 4 is a cross-sectional schematic diagram of the array substrate provided by another embodiment of the present application.

In some embodiments, as shown in FIG. 4, a collimating hole 301 is provided in the black matrix layer 30. The orthographic projection of the light-sensitive component 203 on the base substrate 10 is partially located in the collimating hole 301. Light reflected by fingerprints passing through the collimating hole 301 is more accurately guided to the corresponding light-sensitive component 203, and the collimating hole 301 is configured to block stray light, which is conducive to the reduction of interference and the improvement the sensitivity of fingerprint identification. Wherein specifically, the collimating hole 301 can be a round hole or a square hole. Specifically, in some embodiments, an orthographic projection of a middle part of the light-sensitive component 203 on the base substrate 10 is located in the collimating hole 301, and orthographic projections of two ends of the light-sensitive component 203 on the base substrate 10 overlap with the first light-shielding layer 30 respectively. The collimating hole 301 is provided in the first light-shielding layer 30, the integration of fingerprint identification region of the array substrate can be improved, and the interference of optical noise can be reduced to improve the sensitivity of fingerprint identification at the same time.

In some embodiments, a diameter of the collimating hole ranges from 5 microns to 10 microns. Wherein, the diameter of the collimating hole generally can be determined by the thickness of film layer of the black matrix layer. The larger the thickness is, the larger the diameter of the collimating hole can be. The larger the diameter of the collimating hole is, the larger the light-sensitive region of the light-sensitive component is, which is conducive to the improvement of the sensitivity of the component.

In some embodiments, the light-sensitive component layer 20 further includes a first metal layer 202. The light-sensitive component 203 includes a cathode, the first metal layer 202 includes a touch wire, and the touch wire and the cathode are disposed at interval in the first metal layer 202. The first metal layer 202 is disposed on the base substrate 10, for example, the first metal layer 202 can be made of metal material, i.e., Mo or laminated metal materials, i.e., Ti/Al/Ti, Mo/Cu, Mo/Al/Mo. The first metal layer 202 functions as the cathode of the light-sensitive component 203 in the fingerprint identification region 100b. The cathode and the touch electrode are arranged in the same layer in the first metal layer 202, the integration of fingerprint identification region of the array substrate can be improved, which is conducive to the improvement of the accuracy of fingerprint identification, and also conducive to the reduction of manufacturing processes of the film layers.

In some embodiments, the light-sensitive component layer 20 can also include a first insulating layer 201. The first insulating layer 201 is disposed on the first metal layer 202. A via is located in the first insulating layer 201. The light-sensitive component 203 is disposed on the first insulating layer 201. The light-sensitive component can be PIN (P-type-Intrinsic-N-type) diode including a first semiconductor layer 2031 and an intrinsic semiconductor layer 2032. The intrinsic semiconductor layer 2032 is disposed on the first semiconductor layer 2031. Wherein, the first semiconductor layer 2031 is disposed in the via.

In some embodiments, the light-sensitive component layer 20 can further include a second semiconductor layer 2033. The second semiconductor layer 2033 is disposed on the intrinsic semiconductor layer 2032.

In some embodiments, a material of the first semiconductor layer 2031 is N-type amorphous silicon (N+a-Si) and a material of the intrinsic semiconductor layer 2032 is amorphous silicon (a-Si). A material of the second semiconductor layer 2033 is P-type amorphous silicon (P+a-Si). As amorphous silicon can be made with relatively large thickness, it is conducive to light absorption, which is convenient for forming high-performance light-sensitive sensor, so as to improve the accuracy of fingerprint identification.

In some embodiments, as shown in FIG. 4, the array substrate further includes a second electrode layer 205 and a first electrode layer 204.

The first electrode layer 204 is a bottom-indium tin oxides (BITO) layer. The first electrode layer 204 is disposed on the light-sensitive component layer 20. The first electrode layer 204 includes the touch electrode. The touch wire is connected to the touch electrode of the first metal layer 202. The first metal layer 202 is configured as the touch electrode of the array substrate during a touch period of the display region 100a, and the touch electrode can also be configured as the common electrode of the array substrate during the display period of the display region 100a.

The second electrode layer is a top-indium tin oxides (TITO) layer. The second electrode layer 205 is disposed on the black matrix layer 30. The light-sensitive component 203 includes an anode, the second electrode layer 205 includes a pixel electrode, and the pixel electrode and the anode are disposed at intervals in the second electrode layer 205. Specifically, a second insulating layer 206 is also arranged between the second electrode layer 205 and the first electrode layer 204. Combining FIG. 3 and FIG. 4, as the collimating hole 301 is provided in the black matrix layer 30, the second electrode layer 205 covers a surface of the light-sensitive component 203 through the collimating hole 301, specifically covering the surface of the second semiconductor layer 2033. Wherein, the second electrode layer 205 is configured as the anode of the light-sensitive component 203 in the fingerprint identification region 100b and configured as pixel electrode in the display region 101a. As shown in FIG. 4, the array substrate is also provided with a storage capacitor 207 configured to store charge of the light-sensitive component 203. The storage capacitor 207 includes an upper plate and a lower plate, the lower plate of the storage capacitor 207 is located in the first electrode layer 204, the upper plate of the storage capacitor 207 is located in the second electrode layer 205, and the upper plate and the lower plate are insulated and connected through the second insulating layer 206. The upper plate is connected to the anode of the light-sensitive component, and the lower plate is connected to the cathode of the light-sensitive component through the second electrode layer. The anode and the pixel electrode are arranged in the same layer, the integration of fingerprint identification region of the array substrate can be improved, which is conducive to the improvement of the accuracy of fingerprint identification and also conducive to the reduction of manufacturing processes of the film layers.

In some embodiments, please refer to FIG. 4, the base substrate 10 specifically includes:

a substrate 101 which can be a glass substrate or a flexible substrate. A material of the substrate 101 includes one or more of glass, silica, polyethylene, polypropylene, polystyrene, polylactic acid, polyethylene terephthalate, polyimide and polyurethane.

A polycrystalline silicon layer 102 is arranged on the substrate 101; and the polycrystalline silicon (poly-Si) layer 102 is formed by a laser annealed amorphous silicon (a-Si) layer.

A gate electrode layer 104 is disposed on the gate insulating layer 103. The gate electrode layer 104 is made of metal and includes gate electrode and scanning line electrically connected to the gate electrode.

An insulating interlayer 105 is disposed on the gate electrode layer 104. A though-hole is provided in the insulating interlayer (ILD) 105. The insulating interlayer 105 has a structure of laminated layers and can be made of silicon nitride, silicon oxide, and other materials.

A source and drain electrode layer 106 includes a source electrode and a drain electrode, and is arranged on the insulating interlayer 105. Through-holes to the source end and the drain end of an active layer are formed by etching the insulating interlayer 105. The active layer is partially exposed by each of the through-holes, and then a metal layer including the source and drain electrode layer 106 is formed. The drain electrode is connected with the polysilicon layer 102 through the through-holes. The source electrode and drain electrode are made of conductive materials, and suitable materials are selected from but not limited to transparent conductive materials, i.e., indium tin oxide (ITO), aluminum doped zinc oxide (AZO), etc.

A planarization layer 107 is arranged on the source and drain electrode layer 106. The planarization layer 107 includes one or more of acrylic resin, epoxy resin, phenolic resin, polyamide-based resin, polyimide-based resin, unsaturated polyester resin, polyacrylate, polycarbonate, polyimide, and polystyrene.

In some embodiments, the base substrate 10 further includes a second light-shielding layer 108 and a buffer layer 109.

The second light-shielding layer 108 is disposed on the substrate 101. The second light-shielding layer 108 is a metal light-shielding layer and is patterned by exposure and etching.

The buffer layer 109 is disposed on the second light-shielding layer 108, and the buffer layer 109 can play a role of buffering stress, which can be an organic layer.

The polysilicon layer 102 is disposed on the buffer layer 109. Wherein, when laser annealing the amorphous silicon layer, part of the laser energy passes through the buffer layer 109 below the amorphous silicon layer and is reflected to the amorphous silicon layer through the second light-shielding layer 108; the polysilicon layer 102, the buffer layer 109, and the second light-shielding layer 108 are etched by a first mask process to form the light-shielding pattern, the buffer pattern, and the polysilicon pattern at one time, and then an N+ doped region is formed by doping the poly-Si layer 102 with phosphorus ions. The gate insulating layer 103 is disposed on the polysilicon layer 102.

In some embodiments, as shown in FIG. 4, at least part of the light-sensitive component 203 covers the polysilicon layer 102, which is conducive to the improvement of aperture ratio and the accuracy of fingerprint identification.

On the other hand, in order to better illustrate the display panel of the embodiments of the present application, the embodiments of the present application also provide a display panel, the display panel includes the array substrate, and the display panel can be liquid crystal display panel, OLED panel, etc., which is not specifically defined here.

On the other hand, in order to better illustrate the display panel of the embodiments of the present application, the embodiments of the present application also provide a display device, the display device is a display device with display function, including the above-mentioned display panel. Since the display device of the embodiments of the present application uses the above-mentioned display panel, the display device also has the above beneficial effect, which will not be repeated here. The display device can be a handheld device (smart phone, tablet computer, etc.), a wearable device (smart bracelet, wireless headset, smart watch, smart glasses, etc.), a vehicular equipment (navigator, auxiliary reversing system, dash cam, vehicular refrigerator, etc.), a virtual reality device, an augmented reality device, a terminal device, etc., and there is no restriction here.

In the above embodiments, description of each embodiment has its own emphasis. For part with no detailed description in one embodiment, please refer to relevant description of other embodiments.

The array substrate, the display panel, and the display device provided by the embodiments of the application are described in detail. Specifically, examples are used to illustrate principles and embodiments of the present application. The description of the above embodiments is only intended to help understand the technical schemes and core concepts of this disclosure. It is noted that those with ordinary skill in the technique field could make various modifications to technical schemes or equivalent replacements to part of the technical features described in embodiments above-mentioned, and these modifications and replacement don't make the substantial of corresponding technical schemes out of the scope of technical schemes of embodiments of the present application.

What is claimed is:

1. An array substrate, comprising:
   a base substrate;
   a light-sensitive component layer disposed on the base substrate, wherein a plurality of light-sensitive components are disposed at intervals on the light-sensitive component layer;
   a first light-shielding layer disposed on the light-sensitive component layer and comprising a plurality of black matrices disposed at intervals, wherein an orthographic projection of the first light-shielding layer on the base substrate partially overlaps with an orthographic projection of each of the light-sensitive components on the base substrate;
   a first metal layer disposed on the base substrate, wherein the light-sensitive component comprises a cathode, the first metal layer comprises a touch wire, and the touch wire and the cathode are disposed at intervals in the first metal layer;
   a first electrode layer disposed on the light-sensitive components, wherein the first electrode layer comprises a touch electrode, and the touch wire is connected to the touch electrode; and
   a second electrode layer disposed on the black matrices, wherein the light-sensitive component comprises an anode, the second electrode layer comprises a pixel electrode, and the pixel electrode and the anode are disposed at intervals in the second electrode layer.

2. The array substrate according to claim 1, wherein the first light-shielding layer is a black matrix layer, and an orthographic projection of each of the black matrices on the base substrate partially overlaps with the orthographic projection of each of the light-sensitive components on the base substrate.

3. The array substrate according to claim 2, wherein a thickness of the black matrix layer ranges from 0.3 microns to 1 micron.

4. The array substrate according to claim 1, wherein the light-sensitive component layer comprises:
   a first insulating layer disposed on the first metal layer, wherein a via is located in the first insulating layer;
   a first semiconductor layer disposed in the via; and
   an intrinsic semiconductor layer disposed on the first semiconductor layer.

5. The array substrate according to claim 4, wherein the light-sensitive component layer further comprises:
   a second semiconductor layer disposed on the intrinsic semiconductor layer.

6. The array substrate according to claim 5, wherein a material of the first semiconductor layer comprises N-type amorphous silicon, a material of the intrinsic semiconductor layer comprises amorphous silicon, and a material of the second semiconductor layer comprises P-type amorphous silicon.

7. The array substrate according to claim 1, wherein a collimating hole is located in the first light-shielding layer and the orthographic projection of the light-sensitive component on the base substrate is partially located in the collimating hole.

8. The array substrate according to claim 7, wherein a diameter of the collimating hole ranges from 5 microns to 10 microns.

9. The array substrate according to claim 7, wherein an orthographic projection of a middle part of the light-sensitive component on the base substrate is located in the collimating hole, and orthographic projections of two ends of the light-sensitive component on the base substrate overlap with the first light-shielding layer respectively.

10. A display panel comprising an array substrate, wherein the array substrate comprises:
    a base substrate;
    a light-sensitive component layer disposed on the base substrate, wherein a plurality of light-sensitive components are disposed at intervals on the light-sensitive component layer;
    a first light-shielding layer disposed on the light-sensitive component layer and comprising a plurality of black matrices disposed at intervals, wherein an orthographic projection of the first light-shielding layer on the base substrate partially overlaps with an orthographic projection of each of the light-sensitive components on the base substrate;
    a first metal layer disposed on the base substrate, wherein the light-sensitive component comprises a cathode, the first metal layer comprises a touch wire, and the touch wire and the cathode are disposed at intervals in the first metal layer;

a first electrode layer disposed on the light-sensitive components, wherein the first electrode layer comprises a touch electrode, and the touch wire is connected to the touch electrode; and a second electrode layer disposed on the black matrices, wherein the light-sensitive component comprises an anode, the second electrode layer comprises a pixel electrode, and the pixel electrode and the anode are disposed at intervals in the second electrode layer.

11. The display panel according to claim 10, wherein the first light-shielding layer is a black matrix layer, and an orthographic projection of each of the black matrices on the base substrate partially overlaps with the orthographic projection of each of the light-sensitive components on the base substrate.

12. The display panel according to claim 11, wherein a thickness of the black matrix layer ranges from 0.3 microns to 1 micron.

13. The display panel according to claim 10, wherein the light-sensitive component layer comprises:

a first insulating layer disposed on the first metal layer, wherein a via is located in the first insulating layer;

a first semiconductor layer disposed in the via; and an intrinsic semiconductor layer disposed on the first semiconductor layer.

14. The display panel according to claim 10, wherein a collimating hole is located in the first light-shielding layer, and the orthographic projection of the light-sensitive component on the base substrate is partially located in the collimating hole.

15. The display panel according to claim 14, wherein a diameter of the collimating hole ranges from 5 microns to 10 microns.

16. A display device comprising the display panel of claim 10.

17. The array substrate according to claim 1, further comprising:

a second insulating layer arranged between the second electrode layer and the first electrode layer; and a storage capacitor configured to store charge of the light-sensitive component, wherein the storage capacitor comprises an upper plate located in the first electrode layer and a lower plate located in the second electrode layer, the upper plate and the lower plate are insulated and connected through the second insulating layer, the upper plate is connected to the anode of the light-sensitive component, and the lower plate is connected to the cathode of the light-sensitive component through the second electrode layer.

18. The display panel according to claim 10, wherein the array substrate further comprises:

a second insulating layer arranged between the second electrode layer and the first electrode layer; and a storage capacitor configured to store charge of the light-sensitive component, wherein the storage capacitor comprises an upper plate located in the first electrode layer and a lower plate located in the second electrode layer, the upper plate and the lower plate are insulated and connected through the second insulating layer, the upper plate is connected to the anode of the light-sensitive component, and the lower plate is connected to the cathode of the light-sensitive component through the second electrode layer.

19. The display device according to claim 16, wherein the array substrate further comprises:

a second insulating layer arranged between the second electrode layer and the first electrode layer; and a storage capacitor configured to store charge of the light-sensitive component, wherein the storage capacitor comprises an upper plate located in the first electrode layer and a lower plate located in the second electrode layer, the upper plate and the lower plate are insulated and connected through the second insulating layer, the upper plate is connected to the anode of the light-sensitive component, and the lower plate is connected to the cathode of the light-sensitive component through the second electrode layer.

* * * * *